(12) United States Patent
Shim et al.

(10) Patent No.: US 10,336,919 B2
(45) Date of Patent: Jul. 2, 2019

(54) ADHESIVE COMPOSITION

(71) Applicant: LG CHEM, LTD., Seoul (KR)

(72) Inventors: Jung Sup Shim, Daejeon (KR); Seung Min Lee, Daejeon (KR); So Young Kim, Daejeon (KR); Se Woo Yang, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 15/560,917

(22) PCT Filed: Mar. 24, 2016

(86) PCT No.: PCT/KR2016/003004
§ 371 (c)(1),
(2) Date: Sep. 22, 2017

(87) PCT Pub. No.: WO2016/153294
PCT Pub. Date: Sep. 29, 2016

(65) Prior Publication Data
US 2018/0051193 A1     Feb. 22, 2018

(30) Foreign Application Priority Data
Mar. 24, 2015    (KR) .................... 10-2015-0040740

(51) Int. Cl.
*C09J 123/00* (2006.01)
*C09J 133/00* (2006.01)
*C09J 163/00* (2006.01)
*C08L 33/04* (2006.01)
*C08L 63/00* (2006.01)
*C08L 75/04* (2006.01)
*C08L 101/02* (2006.01)
*B33Y 70/00* (2015.01)
*B32B 37/00* (2006.01)
(Continued)

(52) U.S. Cl.
CPC .......... *C09J 123/00* (2013.01); *B32B 37/0076* (2013.01); *B33Y 70/00* (2014.12); *C08L 23/22* (2013.01); *C08L 33/04* (2013.01); *C08L 63/00* (2013.01); *C08L 75/04* (2013.01); *C08L 101/02* (2013.01); *C09J 123/22* (2013.01); *C09J 133/00* (2013.01); *C09J 163/00* (2013.01); *C08F 2500/02* (2013.01); *H01L 21/3105* (2013.01)

(58) Field of Classification Search
CPC ...................................................... C09J 123/00
See application file for complete search history.

(56) References Cited

U.S. PATENT DOCUMENTS 9,768,386 B2 * 9/2017 Shim .................. H01L 51/5253
2015/0357570 A1 12/2015 Lee et al.

FOREIGN PATENT DOCUMENTS

JP         9-148592 A      6/1997
JP      2014026853 A      2/2014
(Continued)

*Primary Examiner* — Daniel H Lee
(74) *Attorney, Agent, or Firm* — Dentons US LLP

(57) ABSTRACT

Provided are an adhesive composition and an organic electronic device (OED) including the same, and particularly, an adhesive composition, which may form an encapsulation structure effectively blocking moisture or oxygen flowing into an OED from the outside, thereby ensuring the lifespan of the OED, realize a top-emission OED, and exhibit excellent adhesive durability and reliability, and an OED including the same.

17 Claims, 1 Drawing Sheet

(51) Int. Cl.
  *C09J 123/22*    (2006.01)
  *C08L 23/22*     (2006.01)
  *H01L 21/3105*       (2006.01)

(56) References Cited

FOREIGN PATENT DOCUMENTS

| | | | | |
|---|---|---|---|---|
| JP | 2014058618 | A | 4/2014 | |
| KR | 20080030649 | A * | 4/2008 | ............... C09K 3/10 |
| KR | 1020080030649 | A | 4/2008 | |
| KR | 1020080088606 | A | 10/2008 | |
| KR | 1020110014692 | A | 2/2011 | |
| KR | 20120091349 | A * | 8/2012 | ................ C08L 9/00 |
| KR | 1020120091349 | A | 8/2012 | |
| KR | 1020130055541 | A | 5/2013 | |
| KR | 20150010667 | A * | 1/2015 | ............ C09J 133/06 |
| KR | 1020150010667 | A | 1/2015 | |
| WO | 2014/204223 | A1 | 12/2014 | |
| WO | 2015009129 | A1 | 1/2015 | |

\* cited by examiner

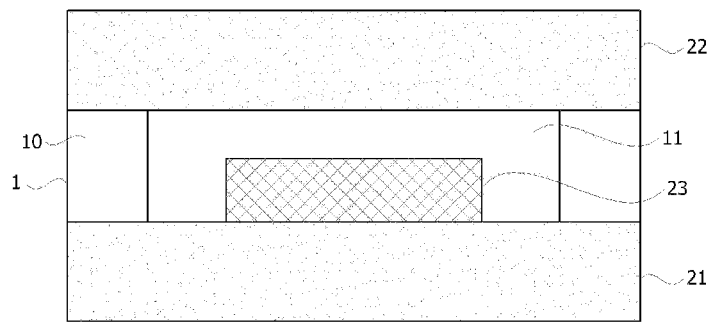

ADHESIVE COMPOSITION

CROSS-REFERENCE TO RELATED APPLICATION

This application is a National Stage Application of International Application No. PCT/KR2016/003004, filed Mar. 24, 2016, and claims the benefit of Korean Patent Application No. 10-2015-0040740, filed on Mar. 24, 2015, contents of which are incorporated herein by reference in their entirety for all purposes as if fully set forth below.

BACKGROUND

1. Field of the Invention

The present application relates to an adhesive composition, an organic electronic device (OED) including the same, and a method of manufacturing the OED.

2. Discussion of Related Art

An OED is a device including an organic material layer in which electric charges are exchanged using holes and electrons, and the OED may be, for example, a photovoltaic device, a rectifier, a transmitter, or an organic light emitting diode (OLED).

Among the OEDs, an OLED has lower power consumption and a higher response speed, and is more advantageous in reducing the thickness of a display device or lighting than a conventional light source. Such an OLED also has excellent space utilization, and is expected to be applied to various fields including all types of portable devices, monitors, notebook computers and TVs.

For commercialization and expanded use of the OLED, the most critical problem is durability. Organic materials and metal electrodes included in the OLED are very easily oxidized by an external factor, for example, moisture. Therefore, a product including an OLED is very sensitive to environmental factors. For this reason, various methods have been suggested to effectively prevent the permeation of oxygen or moisture into an OED such as an OLED from the outside.

Patent Document 1 discloses an adhesive capsulation composition film and an organic electroluminescent element, where the composition is a polyisobutylene (PIB)-based pressure-sensitive adhesive and does not have high processability and has low reliability under a high-temperature and high-humidity condition.

PRIOR ART DOCUMENT

Patent Document (Patent Document 1) Korean Unexamined Patent Application Publication No. 2008-0088606

SUMMARY OF THE INVENTION

The present application provides an adhesive composition, which can form an encapsulation structure effectively blocking moisture or oxygen flowing into an OED from the outside, thereby ensuring the lifespan of the OED, realize a top-emission OED, and exhibit a moisture barrier property and excellent durability and reliability at high temperature and high humidity, and an OED including the same.

The present application relates to an adhesive composition. The adhesive composition may be an encapsulation material applied to encapsulate or capsulate the OED such as an OLED. In one exemplary embodiment, the adhesive composition of the present application may be applied to encapsulate or capsulate at least one of the side surfaces of an organic electronic element. Therefore, after being applied in capsulation, the adhesive composition may be present at a peripheral portion of the OED.

The term "OED" used herein refers to a product or device having a structure including an organic material layer in which electric charges are exchanged using holes and electrons between a pair of facing electrodes, and examples of the OED may include, but the present application is not limited to, a photovoltaic device, a rectifier, a transmitter, and an OLED. In an exemplary embodiment of the present application, the OED may be an OLED.

The exemplary adhesive composition may include an olefin-based resin having a water vapor transmission rate (WVTR) of 50 $g/m^2 \cdot day$ or less, a heat-curable resin, and a photocurable compound. Since using a heat-curable resin and a photocurable compound in addition to an olefin-based resin having a low WVTR, the present application may exhibit an excellent water barrier performance and provide excellent durability and reliability at high temperature and high humidity.

Also, to seal the side surfaces of the organic electronic element, a process of coating the surfaces with a liquid adhesive composition is performed. However, conventionally, after coating, there is difficulty in maintaining a desired capsulated shape due to the high fluidity of the composition. In the present application, the adhesive composition that has been applied to a desired position may be precured by light irradiation to control fluidity, and then subjected to main curing. Therefore, in the present application, the applied adhesive composition may be maintained in the desired capsulated shape before main curing. That is, in the present application, as the adhesive composition includes both of the curable resin and the radical photocurable compound, a double curing method may be introduced, and therefore the fluidity of the adhesive composition can be controlled at high temperature after coating.

The adhesive composition of the present application may include an olefin-based resin having a WVTR of 50 $g/m^2 \cdot day$ or less. The adhesive composition of the present application may include the olefin-based resin satisfying the above WVTR range, and when considering that it is applied to encapsulate or capsulate an OED, it can provide an excellent moisture barrier property. The term "resin having a WVTR of 50 $g/m^2 \cdot day$ or less" used herein may refer to a resin having a WVTR of 50 $g/m^2 \cdot day$ or less, measured in a thickness direction of a film when the film is formed in a layer of the resin to a thickness of 100 μm. The WVTR may be 50, 40, 30, 20 or 10 $g/m^2 \cdot day$ or less, measured at 100° F. and a relative humidity of 100%. As the WVTR is lower, a more excellent moisture barrier property may be exhibited. The lower limit may be, but is not particularly limited to, for example, 0 $g/m^2 \cdot day$ or 0.1 $g/m^2 \cdot day$.

In detail, the exemplary olefin-based resin of the present application includes an olefin-based resin derived from a mixture of monomers, and the mixture may have an isoolefin monomer component or multiolefin monomer component having at least 4 to 7 carbon atoms. The isoolefin may be present in the range of, for example, 70 to 100 wt % or 85 to 99.5 wt % with respect to the total weight of the monomer. The multiolefin-derived component may be present in the range of 0.5 to 30 wt %, 0.5 to 15 wt % or 0.5 to 8 wt %.

The isoolefin may be, for example, isobutylene, 2-methyl-1-butene, 3-methyl-1-butene, 2-methyl-2-butene, 1-butene, 2-butene, methyl vinyl ether, indene, vinyltrimethylsilane, hexene or 4-methyl-1-pentene. The multiolefin may have 4 to 14 carbon atoms, and may be, for example, isoprene, butadiene, 2,3-dimethyl-1,3-butadiene, myrcene, 6,6-dimethyl-fulvene, hexadiene, cyclopentadiene or piperylene. Other polymerizable monomers, for example, styrene and dichlorostyrene may also be homopolymerized or copolymerized.

In the present application, the olefin-based resin may include an isobutylene-based homopolymer or copolymer. As described above, an isobutylene-based olefin-based resin or polymer may refer to an olefin-based resin or polymer including 70 mol % or more of isobutylene-derived repeat units and one or more different polymerizable unit.

In the present application, the olefin-based resin may be butyl rubber or branched butyl-like rubber. The exemplary olefin-based resin is a unsaturated butyl rubber such as a copolymer of an olefin or isoolefin and a multiolefin. As the olefin-based resin included in the adhesive composition of the present application, poly(isobutylene-co-isoprene), polyisoprene, polybutadiene, polyisobutylene, poly(styrene-co-butadiene), natural rubber, butyl rubber and a mixture thereof may be used. The available olefin-based resin in the present application may be prepared by any of the suitable means known in the art, and the present application is not limited to the method of preparing the olefin-based resin.

In one exemplary embodiment, the olefin-based resin may be a low molecular weight polyisobutylene resin. For example, the olefin-based resin may have a weight average molecular weight of 100,000 or less, and 500 or more or 55,000 or more. The present application may realize a suitable adhesive composition for coating and capsulating processes by controlling the weight average molecular weight of the olefin-based resin in the above range. The adhesive composition may have a liquid phase, and may be suitably applied to encapsulate side surfaces of the following OED.

Also, in one exemplary embodiment, the olefin-based resin may be a resin having one or more reactive functional groups having reactivity with the above-described heat-curable resin. The reactive functional group included in the olefin-based resin may be a polar functional group. A type of the reactive functional group is not particularly limited, and may be, for example, an acid anhydride group, a carboxyl group, an epoxy group, an amino group, a hydroxyl group, an isocyanate group, an oxazoline group, an oxetane group, a cyanate group, a phenol group, a hydrazide group or an amide group. Examples of the olefin-based resin having the reactive functional group may include succinic anhydride-modified polyisobutylene, maleic anhydride-modified liquid polyisobutylene, maleic anhydride-modified liquid polyisoprene, epoxy-modified polyisoprene, hydroxyl group-modified liquid polyisoprene, and allyl-modified liquid polyisoprene. The present application may provide an adhesive having properties such as desired moisture barrier property and durability and reliability after curing by forming a crosslinked structure between the olefin-based resin and a heat-curable resin that will be described below.

In an exemplary embodiment of the present application, the adhesive composition may include a heat-curable resin. The heat-curable resin may be a resin including one or more heat-curable functional groups. A specific type of the curable resin that can be used in the present application is not particularly limited, and for example, various heat-curable resins known in the art may be used.

In the specification, the term "heat-curable resin" refers to a resin that can be cured by a suitable heating or aging process, and the term "photocurable resin" used herein refers to a resin that can be cured by irradiation of electromagnetic waves.

In the present application, a specific type of the heat-curable resin is not particularly limited as long as a resin has the above-described properties. For example, the heat-curable resin may have an adhesive property after being cured, and may be a resin including one or more heat-curable functional groups such as an epoxy group, a glycidyl group, an isocyanate group, a hydroxyl group, a carboxyl group or an amide group. Also, specific types of such a resin may include, but are not limited to, an acrylic resin, a polyester resin, an isocyanate resin, and an epoxy resin, and preferably, an epoxy acrylate or a urethane acrylate.

In the present application, as the heat-curable resin, an aromatic or aliphatic, or linear or branched epoxy resin may be used. In one exemplary embodiment of the present application, an epoxy resin may contain two or more functional groups and have an epoxy equivalent weight of 180 to 1,000 g/eq. Characteristics of a cured product such as adhesive performance and a glass transition temperature may be effectively maintained by the epoxy resin having the above range of the epoxy equivalent weight. Such an epoxy resin may be one or a mixture of two or more of a cresol novolac epoxy resin, a bisphenol A-type epoxy resin, a bisphenol A-type novolac epoxy resin, a phenol novolac epoxy resin, a tetrafunctional epoxy resin, a biphenyl-type epoxy resin, a triphenol methane-type epoxy resin, an alkyl-modified triphenol methane epoxy resin, a naphthalene-type epoxy resin, a dicyclopentadiene-type epoxy resin, and a dicyclopentadiene-modified phenol-type epoxy resin.

In the present application, as a curable resin, an epoxy resin having a cyclic structure in a molecular structure may be used, and for example, an alicyclic epoxy resin may be used. Since the alicyclic epoxy resin has excellent compatibility with the olefin-based resin or the photocurable compound, it is cured without phase separation, and therefore uniform crosslinks in an adhesive may be realized.

In one exemplary embodiment, the heat-curable resin may be included at 10 to 70 parts by weight with respect to 100 parts by weight of the olefin-based resin. Specifically, the heat-curable compound may be included at 15 to 65 parts by weight, 20 to 60 parts by weight or 26 to 55 parts by weight with respect to 100 parts by weight of the olefin-based resin. The present application may provide an adhesive composition having excellent durability and long-term reliability by controlling the content of the heat-curable resin within the above range.

Also, the adhesive composition may include a heat-curing agent. A suitable type of heat-curing agent may be selected and used depending on the type of the heat-curable resin or a functional group included in the heat-curable resin.

In one exemplary embodiment, when the heat-curable resin is an epoxy resin, as a curing agent for an epoxy resin known in the art, for example, one or two or more of an amine curing agent, an imidazole curing agent, a phenol curing agent, a phosphorus curing agent and an acid anhydride curing agent may be used, but the present application is not limited thereto.

In one exemplary embodiment, as the heat-curing agent, an imidazole compound, which is in a solid phase at room temperature and has a melting point or decomposition temperature of 80° C. or more, may be used. Such a compound may be, for example, 2-methyl imidazole, 2-heptadecyl imidazole, 2-phenyl imidazole, 2-phenyl-4-methyl imidazole or 1-cyanoethyl-2-phenyl imidazole, but the present application is not limited thereto.

A content of the heat-curing agent may be selected depending on a composition of the composition, for example, a type or ratio of the heat-curable resin. For example, the heat-curing agent may be included at 1 to 30 parts by weight, 5 to 28 parts by weight or 5 to 27 parts by weight with respect to 100 parts by weight of the heat-curable resin. The weight ratio may be adjusted according to the type and ratio of the heat-curable resin or a functional group thereof, or a crosslinking density to be realized.

In an exemplary embodiment of the present application, the heat-curing agent may be a latent curing agent such as an imidazole-isocyanuric acid addition product, an amine-epoxy addition product, a boron trifluoride-amine complex or a capsulated imidazole. That is, a radical initiator that will be described below may be a photoradical initiator, and in the present application, light irradiation may be first performed in a curing process for the adhesive composition to control initial fluidity, and the heat-curing agent, as a latent curing agent, may serve to cure a heat-curable resin when heated after the light irradiation.

In an exemplary embodiment of the present application, the adhesive composition may include a photocurable compound. The photocurable compound may be a radical photocurable compound. The radical photocurable compound may include, for example, a multifunctional polymerizable compound which has high compatibility with the above-described olefin-based resin and curable resin and is capable of forming a specific crosslinked structure. Also, in one exemplary embodiment, the crosslinked structure may be a crosslinked structure formed by heating, a crosslinked structure formed by the irradiation of active energy rays or a crosslinked structure formed by aging at room temperature. Here, in the category of the "active energy rays," microwaves, infrared (IR) rays, UV (UV) rays, X rays, gamma rays, and particle beams including alpha-particle beams, proton beams, neutron beams and electron beams may be included, and generally, UV rays or electron beams may be used.

In an exemplary embodiment, the radical photocurable compound may be a multifunctional active energy ray-polymerizable compound, which may be, for example, a compound including two or more functional groups capable of participating in polymerization by the irradiation of active energy rays, for example, functional groups including an ethylene-like unsaturated double bond such as acryloyl groups, methacryloyl groups, acryloyloxy groups or methacryloyloxy groups or functional groups such as epoxy groups or oxetane groups. In one exemplary embodiment, the multifunctional active energy ray-polymerizable compound may be a bi- or higher functional compound.

In an exemplary embodiment of the present application, as the multifunctional active energy ray polymerizable compound, for example, a multifunctional acrylate (MFA) may be used.

In an exemplary embodiment of the present application, the radical photocurable compound may satisfy Formula 1.

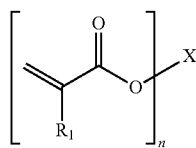

[Formula 1]

In Formula 1, $R_1$ is hydrogen or an alkyl group having 1 to 4 carbon atoms, n is an integer of 2 or higher, and X is a residue derived from a linear, branched or cyclic alkyl or alkenyl group having 3 to 30 carbon atoms. Here, when X is a residue derived from a cyclic alkyl or alkenyl group, X may be a residue derived from a cyclic alkyl or alkenyl group having 3 to 30, 4 to 28, 6 to 28, 8 to 22, or 12 to 20 carbon atoms. Also, when X is a residue derived from a linear alkyl or alkenyl group, X may be a residue derived from a linear alkyl or alkenyl group having 3 to 30, 4 to 28, 6 to 25, or 8 to 20 carbon atoms. Also, when X is a residue derived from a branched alkyl or alkenyl group, X may be a residue derived from a branched alkyl or alkenyl group having 3 to 30, 4 to 28, 5 to 25, or 6 to 20 carbon atoms.

The term "residue derived from an alkyl or alkenyl group" used herein may refer to a residue of a specific compound, for example, an alkyl or alkenyl group. In an exemplary embodiment, in Formula 1, when n is 2, X may be an alkylene or alkylidene group. Also, when n is 3 or higher, X may be an alkyl or alkenyl group from which two or more hydrogen atoms are released and then linked to a (meth)acryloyl group of Formula 1. n may be one in the range of 2 to 20.

The term "alkyl group" or "alkenyl group" used herein may be, unless particularly defined otherwise, an alkyl or alkenyl group having 1 to 30, 1 to 25, 1 to 20, 1 to 16, 1 to 12, 1 to 8, or 1 to 4 carbon atoms. The alkyl or alkenyl group may have a linear, branched or cyclic structure, and may be arbitrarily substituted by one or more substituents.

The term "alkylene group" or "alkylidene group" used herein may be, unless particularly defined otherwise, an alkylene or alkylidene group having 2 to 30, 2 to 25, 2 to 20, 2 to 16, 2 to 12, 2 to 10, or 2 to 8 carbon atoms. The alkylene or alkylidene group may have a linear, branched or cyclic structure, and may be arbitrarily substituted by one or more substituents.

The term "alkoxy group" used herein may be, unless particularly defined otherwise, an alkoxy group having 1 to 20, 1 to 16, 1 to 12, 1 to 8, or 1 to 4 carbon atoms. The alkoxy group may have a linear, branched or cyclic structure. Also, the alkoxy group may be arbitrarily substituted by one or more substituents.

The photocurable compound may be included at 10 to 100 parts by weight, 10 to 80 parts by weight, 13 to 60 parts by weight, 14 to 40 parts by weight or 14 to 20 parts by weight with respect to 100 parts by weight of the olefin-based resin. The present application may provide a cured product of an adhesive by adjusting a content of the photocurable compound in the above range to maintain a capsulated structure during precuring.

In one exemplary embodiment, the multifunctional active energy ray polymerizable compound that can be polymerized by the irradiation of active energy rays may be polybutadiene dimethacrylate, 1,4-butanediol di(meth)acrylate, 1,3-butylene glycol di(meth)acrylate, 1,6-hexanediol di(meth)acrylate, 1,8-octanediol di(meth)acrylate, 1,12-dodecanediol di(meth)acrylate, neopentylglycol di(meth)acrylate, dicyclopentanyl di(meth)acrylate, cyclohexane-1,4-dimethanol di(meth)acrylate, tricyclodecanedimethanol (meth)diacrylate, dimethylol dicyclopentane di(meth)acrylate, neopentyl glycol modified trimethylolpropane di(meth)acrylate, adamantane di(meth)acrylate, trimethylolpropane tri(meth)acrylate, or mixtures thereof.

In an exemplary embodiment, the adhesive composition may include a radical initiator as well as the photocurable compound. The radical initiator may be a photoradical initiator. A specific type of the photoinitiator may be suitably selected by considering a curing rate and yellowing probability. For example, a benzoin-based, hydroxyketone-based, aminoketone-based or phosphine oxide-based photoinitiator may be used, and specifically, benzoin, benzoin methylether, benzoin ethylether, benzoin isopropylether, benzoin n-butylether, benzoin isobutylether, acetophenone, dimethylamino acetophenone, 2,2-dimethoxy-2-phenylacetophenone, 2,2-diethoxy-2-phenylacetophenone, 2-hydroxy-2-methyl-1-phenylpropane-1-one, 1-hydroxycyclohexyl phenylketone, 2-methyl-1-[4-(methylthio)phenyl]-2-morpholino-propane-1-one, 4-(2-hydroxyethoxy)phenyl-2-(hydroxy-2-propyl)ketone, benzophenone, p-phenylbenzophenone, 4,4'-diethylaminobenzophenone, dichlorobenzophenone, 2-methylanthraquinone, 2-ethylanthraquinone, 2-t-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzyldimethylketal, acetophenone dimethylketal, p-dimethylamino benzoic acid ester, oligo[2-hydroxy-2-methyl-1-[4-(1-methylvinyl)phenyl]propanone] or 2,4,6-trimethylbenzoyl-diphenyl-phosphineoxide may be used.

A content of the photoradical initiator may be changed by the type and ratio of a functional group of the radical photocurable compound, or a crosslinking density to be realized. For example, the photoradical initiator may be mixed at 0.1 to 20 parts by weight or 0.1 to 15 parts by weight with respect to 100 parts by weight of the photocurable compound. The present application may introduce a suitable crosslinked structure to the adhesive composition by controlling the content of the photoradical initiator in the above range, and therefore the fluidity may be controlled at high temperature.

In one exemplary embodiment, the adhesive composition of the present application may include 40 to 90 parts by weight of the olefin-based resin having a WVTR of 50 g/m²·day or less, 5 to 50 parts by weight of the heat-curable resin, and 1 to 40 parts by weight of the photocurable compound. In another exemplary embodiment, the adhesive composition may include 50 to 80 parts by weight of the olefin-based resin having a WVTR of 50 g/m²·day or less, 10 to 40 parts by weight of the heat-curable resin, and 5 to 30 parts by weight of the photocurable compound. The present application may exhibit an excellent moisture barrier performance and excellent durability and reliability at high temperature and high humidity by adjusting the content range of each component of the adhesive composition as described above.

The adhesive composition of the present application may also include a moisture absorbent. The term "moisture absorbent" used herein may be a general term for a component capable of adsorbing or removing moisture or vapor introduced from the outside through a physical or chemical reaction. That is, the moisture absorbent may refer to a moisture reactive absorbent, a physical absorbent, or a mixture thereof.

The moisture reactive absorbent chemically reacts with vapor, moisture or oxygen flowing into the resin composition or cured product thereof to adsorb the moisture or vapor. The physical absorbent allows to prolong a migration pathway of the moisture or vapor permeating the resin composition or cured product thereof, and thus may inhibit the permeation of the moisture or vapor and maximize a barrier property against the moisture and vapor through a matrix structure of the resin composition or cured product thereof and an interaction with the moisture reactive absorbent.

A specific type of the moisture absorbent that can be used in the present application may be, but is not particularly limited to, for example, one or a mixture of two or more of a metal oxide, a metal salt, and phosphorus pentoxide ($P_2O_5$) as a moisture reactive absorbent, and may be zeolite, zirconia or montmorillonite as a physical absorbent.

Here, specifically, the metal oxide may be lithium oxide ($Li_2O$), sodium oxide ($Na_2O$), barium oxide (BaO), calcium oxide (CaO) or magnesium oxide (MgO), and the metal salt may be, but is not limited to, a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), or nickel sulfate ($NiSO_4$); a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$), or magnesium iodide ($MgI_2$); or a metal chlorate such as barium perchlorate ($Ba(ClO_4)_2$) or magnesium perchlorate ($Mg(ClO_4)_2$).

In the present application, the moisture absorbent such as the metal oxide, which has been suitably processed, may be mixed with the composition. For example, a grinding process for the moisture absorbent may be needed, and to this end, three-roll milling, bead milling or ball milling may be used.

The adhesive composition of the present application may include the moisture absorbent at 5 to 100 parts by weight, 5 to 90 parts by weight, 5 to 80 parts by weight or 10 to 50 parts by weight with respect to 100 parts by weight of the olefin-based resin. In the adhesive composition of the present application, the content of the moisture absorbent may be controlled to be 5 parts by weight or more, so that the adhesive composition or cured product thereof may exhibit the excellent moisture and vapor barrier property. Also, as the content of the moisture absorbent is controlled to be 100 parts by weight or less, when a thin film-type encapsulation structure is formed, an excellent moisture barrier property may be exhibited.

Also, in one exemplary embodiment, the adhesive composition of the present application may have a thixotropic index (TI) was calculated by General Equation 1 in the range of 1.35 to 5.

$$T = V_{0.5}/V_5 \qquad \text{[General Equation 1]}$$

In General Equation 1, $V_{0.5}$ is a viscosity of the adhesive composition measured using a Brookfield viscometer with an RV-7 spindle at a temperature of 25° C. and a rotational speed of 0.5 rpm, and $V_5$ is a viscosity of the adhesive composition measured using a Brookfield viscometer with an RV-7 spindle at a temperature of 25° C. and a rotational speed of 5 rpm. Specifically, the thixotropic index (TI) may be in the range of 1.35 to 5 or 1.39 to 3.3. The term "thixotropy" used herein may refer to a property of the composition in which there is no fluidity in a stationary state, but there is fluidity when oscillated.

In the present application, as the thixotropic index (TI) of the adhesive composition is controlled as described above, an encapsulation structure having an excellent moisture barrier property may be provided via an olefin-based resin and the problem of bubbles flowing into the encapsulation material in a process of encapsulating an organic electronic element or blocking of a nozzle during coating of the composition may be prevented, and thus processability and productivity may be enhanced.

In one exemplary embodiment, the adhesive composition may have a viscosity, measured with respect to a torque using a Brookfield viscometer with an RV-7 spindle at a temperature of 25° C. and a rotational speed of 0.5 rpm, in the range of 100,000 to 1,000,000 cPs. Specifically, in the present application, the viscosity may be, unless particularly defined otherwise, measured using DV-II+Pro as a Brookfield viscometer with an RV-7 spindle under conditions of a temperature of 25° C. and a rotational speed of 0.5 rpm, and the viscosity range may be 100,000 to 1,000,000 cPs, 200,000 to 900,000 cPs or 300,000 to 800,000 cPs. As the viscosity of the composition at room temperature is controlled to be 100,000 cPs or more, the precipitation of a material present in the composition, for example, a moisture absorbent or an inorganic filler can be prevented, and a desired shape of encapsulation structure can be formed and maintained by coating a desired position with the composition.

In one exemplary embodiment, the adhesive composition may further include an inorganic filler. The filler, other than the above-described moisture absorbent, may be included to control the thixotropic index (TI) of the adhesive composition. As described above, the thixotropic index (TI) of the adhesive composition needs to be controlled within a specific range. A method of controlling the thixotropic index (TI) within the above range is not particularly limited, but may use an adequate amount of the inorganic filler. A specific type of the filler that can be used in the present application may be, but is not particularly limited to, for example, one or a mixture of two or more of clay, talc, alumina, calcium carbonate and silica.

Also, to increase coupling efficiency between a filler and an organic binder, the present application may use a product which is subjected to surface treatment with an organic material as the filler, or further include a coupling agent.

The adhesive composition of the present application may include the inorganic filler at 0 to 50 parts by weight, 1 to 40 parts by weight, or 1 to 20 parts by weight with respect to 100 parts by weight of the olefin-based resin. The present application may provide an encapsulation structure having excellent moisture or vapor barrier property and mechanical property by controlling the content of the inorganic filler to be, preferably, 1 part by weight or more. Also, the present application may provide a cured product exhibiting an excellent moisture barrier property even when formed in a thin film by controlling the content of the inorganic filler to 50 parts by weight or less.

Also, the inorganic filler may have a BET surface area in the range of 35 to 500 $m^2/g$, 40 to 400 $m^2/g$, 50 to 300 $m^2/g$ or 60 to 200 $m^2/g$. The specific surface area is measured using a BET method, specifically, by adding 1 g of a sample of the inorganic filler into a tube and then measuring a specific surface area at −195° C. using ASAP2020 (Micromeritics, US) without pretreatment. The same sample may be subjected to such measurement 3 times, thereby obtaining an average value. The present application may provide an encapsulation material for facilitating the realization of a desired encapsulation structure in the present application by adjusting the specific surface area of the inorganic filler within the above range.

In the adhesive composition of the present application, in addition to the above-described components, various additives may be included without affecting the above-described effects of the present application. For example, the resin composition may include a defoaming agent, a coupling agent, a tackifier, a UV stabilizer or an antioxidant at a proper range of content according to desired physical properties. In one exemplary embodiment, the adhesive composition may further include a defoaming agent. As the present application includes a defoaming agent, a defoaming property is realized in the above-described coating process of the adhesive composition, and thus a reliable encapsulation structure may be provided. Also, as long as the physical properties of the adhesive composition required in the present application are satisfied, the type of a defoaming agent is not particularly limited.

In one exemplary embodiment, the adhesive composition may be a liquid at room temperature, for example, about 25° C. In an exemplary embodiment of the present application, the adhesive composition may be a solventless-type liquid. Here, the photocurable compound may be applied as a reactive diluent in the solventless-type liquid composition. The adhesive composition may be applied to encapsulate an organic electronic element, and specifically, to encapsulate the side surfaces of the organic electronic element. In the present application, since the adhesive composition is a liquid at room temperature, the element may be encapsulated by a method of coating the side surfaces of the organic electronic element with the composition.

The exemplary adhesive composition may have a viscosity of 700 to 5,000 Pa·s after light irradiation. Within the above range of viscosity, the adhesive composition may maintain a desired shape of the encapsulation structure. In one exemplary embodiment, the viscosity of the adhesive composition may be measured after the adhesive composition is irradiated with light in an UV-A wavelength range at a dose of 3 $J/cm^2$. Also, the viscosity of the adhesive composition may be the viscosity measured with respect to shear stress under conditions of a temperature of 25° C., a strain of 10% and a frequency of 1 Hz. In one exemplary embodiment, the viscosity of the composition may be 700 to 4,000 Pa·s, 800 to 3,000 Pa·s or 900 to 2,000 Pa·s.

The term "UV-A wavelength range" used herein may refer to the wavelength range of 315 to 400 nm. Specifically, in the specification, the light having the UV-A wavelength range may refer to light having any one wavelength in the range of 315 to 400 nm, or light having two or more wavelengths in the range of 315 to 400 nm.

In an exemplary embodiment of the present application, the adhesive composition may be heated after the light irradiation to perform main curing, resulting in an encapsulation structure of an OED. The heat-curing may be performed at 40 to 100° C. To form the encapsulation structure, the adhesive composition needs physical properties such that main curing can be performed without a change in a shape of the UV-precured composition even at the high curing temperature. That is, it is necessary to prevent the phenomenon of diffusing the adhesive composition at high temperature. In one exemplary embodiment, the adhesive composition may be precured by irradiation of light in the UV-A wavelength range at a dose of 3 $J/cm^2$ as described above, and the precured resin composition may have a viscosity of 500 to 2,000 Pa·s, which is measured with respect to shear stress under conditions of a temperature of 80° C., a strain of 10% and a frequency of 1 Hz. The viscosity may be, for example, 500 to 1,800 Pa·s, 500 to 1,600 Pa·s or 600 to 1,500 Pa·s. The adhesive composition of the present application may satisfy the above range of viscosity, and therefore may be effectively applied to encapsulate the side surfaces of an OED.

The present application also relates to an OED. The exemplary OED may include, as shown in FIG. 1, a substrate 21; an organic electronic element 23 formed on the substrate 21; and a side encapsulation layer 10 formed on a peripheral portion of the substrate 21 to surround side surfaces of the organic electronic element 23, and including the above-described adhesive composition. Also, the exemplary OED may further include a entire encapsulation layer 11 covering the entire surface of the organic electronic element 23.

The entire encapsulation layer and the side encapsulation layer may be formed in the same plane. Here, the term "same" used herein may be substantially the same. For example, the expression "substantially the same" in the same plane means that there may be an error of ±5 or ±1 µm in a thickness direction. The entire encapsulation layer may encapsulate the top surface of the element, or encapsulate the side surfaces of the element as well as the top surface thereof. The side encapsulation layer may be formed on the side surfaces of the element, but may not be in direct contact with the side surfaces of the organic electronic element. For example, the organic electronic element may be encapsulated such that the entire encapsulation layer may be in direct contact with the top and side surfaces of the element. That is, the side encapsulation layer may not be in contact with the element, but may be disposed on the peripheral portion of the substrate in the plan view of the OED.

The term "peripheral portion" used herein refers to an edge. That is, a peripheral portion of the substrate may refer to an edge of the substrate.

A material for constituting the side encapsulation layer may include, but is not particularly limited to, the above-described adhesive composition.

Meanwhile, the entire encapsulation layer may include an encapsulation resin, and the encapsulation resin may be an acrylic resin, an epoxy resin, a silicone resin, a fluorine resin, a styrene resin, a polyolefin resin, a thermoplastic elastomer, a polyoxyalkylene resin, a polyester resin, a polyvinyl chloride resin, a polycarbonate resin, a polyphenylenesulfide resin, a polyamide resin or a mixture thereof. A component for constituting the entire encapsulation layer may be the same as or different from the above-described adhesive composition. However, since the entire encapsulation layer is in direct contact with the element, the entire encapsulation layer may not include or may include a small amount of the above-described moisture absorbent. For example, the entire encapsulation layer may be included at 0 to 20 parts by weight with respect to 100 parts by weight of the encapsulation resin.

In one exemplary embodiment, the organic electronic element may include a reflective electrode layer formed on a substrate, an organic layer formed on the reflective electrode layer and at least including an emitting layer, and a transparent electrode layer formed on the organic layer.

In the present application, the organic electronic element 23 may be an OLED.

In one exemplary embodiment, the OED according to the present application may be, but is not limited to, a top-emission OED or a bottom-emission OED.

The OED may further include a protective film for protecting the organic electronic element between the above-described entire encapsulation layer or side encapsulation layer and the organic electronic element.

Also, the present application relates to a method of manufacturing an OED.

In one exemplary embodiment, the manufacturing method may include applying the above-described adhesive composition to a peripheral portion of a substrate 21 on which an organic electronic element 23 is formed to surround side surfaces of the organic electronic element 23. The application of the adhesive composition may be a step for forming the above-described side encapsulation layer 10.

Here, the substrate 21 on which the organic electronic element 23 is formed may be manufactured by forming a reflective electrode or a transparent electrode on the substrate 21 such as a glass or film by vacuum deposition or sputtering, and forming an organic material layer on the reflective electrode. The organic material layer may include a hole injection layer, a hole transport layer, an emitting layer, an electron injection layer and/or an electron transport layer. Subsequently, a second electrode may be further formed on the organic material layer. The second electrode may be a transparent electrode or a reflective electrode. Afterward, the above-described side encapsulation layer 10 is applied to the peripheral portion of the substrate 21 to cover the side surfaces of the organic electronic element 23. Here, a method of forming the side encapsulation layer 10 is not particularly limited, and may use a technique such as screen printing or dispenser coating to coat the side surfaces of the substrate 21 with the above-described adhesive composition. Also, a entire encapsulation layer 11 for encapsulating the entire surface of the organic electronic element 23 may be applied. A method of forming the entire encapsulation layer 11 may use a technique known in the art, for example, one drop filling.

Also, in the present application, a curing process may be performed on the full or side encapsulation layer for encapsulating an OED, and such a curing process (main curing) may be performed in, for example, a heating chamber or a UV chamber, and preferably performed in both chambers. Conditions for the main curing may be suitably selected according to the stability of an OED.

In one exemplary embodiment, the side encapsulation layer may be formed by coating of the above-described adhesive composition, and then the composition may be irradiated with light, thereby inducing crosslinking. The light irradiation may include irradiating the composition with light in the UV-A wavelength range at a dose of 0.3 to 6 $J/cm^2$ or 0.5 to 4 $J/cm^2$. As described above, a basic shape of the encapsulation structure may be realized by precuring through light irradiation.

In one exemplary embodiment, the manufacturing method may further include heat-curing the precured adhesive composition at a temperature of 40 to 100° C. for 1 to 24 hours, 1 to 20 hours, 1 to 10 hours or 1 to 5 hours after the light irradiation. Through the heating step, the adhesive composition may be subjected to main curing.

Effect

The present application provides an adhesive composition, which can form a structure for effectively blocking moisture or oxygen flowing into an OED from the outside, thereby ensuring the lifespan of an OED, realize a top-emission OED, and exhibit a moisture barrier property and excellent adhesive durability and reliability, and an OED including the same.

BRIEF DESCRIPTION OF THE DRAWINGS

FIG. 1 is a cross-sectional view of an OED according to an exemplary embodiment of the present application.

EXPLANATION OF REFERENCE NUMERALS

1: adhesive
10: side encapsulation layer

11: entire encapsulation layer
21: substrate
22: cover substrate
23: organic electronic element

DETAILED DESCRIPTION OF EXEMPLARY EMBODIMENTS

Hereinafter, the present application will be described in further detail with reference to examples according to the present application and comparative examples not according to the present application, and the scope of the present application is not limited to the following examples.

EXAMPLE 1

A polyisobutylene resin (DAELIM, PB2400, Mn=2,400 g/mol, Mw=4,300 g/mol) as an olefin-based resin, an alicyclic epoxy resin (Mitsubishi Chemical, YX8000, epoxy equivalent weight: 205 g/eq, viscosity: 18500 cPs) as a heat-curable resin and trimethylol propane triacrylate (Sartomer, SR351) as a photocurable compound were put into a mixing vessel in a weight ratio of 60:30:10 (PB2400:YX8000:SR351) at room temperature. As a radical initiator, 1 part by weight of bis(2,4,6-trimethylbenzoyl)-phenylphosphineoxide (Irgacure 819, BASF) was put into the vessel with respect to 100 parts by weight of the main components (the olefin-based resin, the heat-curable resin and the photocurable compound), as a heat-curing agent, 5 parts by weight of an imidazole-based curing agent (2P4MZ, 2-phenyl-4-methylimidazole, Shikoku) was put into vessel with respect to 100 parts by weight of the main components, and 1 part by weight of an epoxy silane (glycidyloxypropyl trimethoxysilane, KBM403, Shinetsu) was put into the vessel with respect to 100 parts by weight of the main components. Also, as an inorganic filler, 3 parts by weight of fumed silica (Aerosil, Evonik, R805, particle size: about 10~20 nm) was put into the vessel with respect to 100 parts by weight of the main components. Meanwhile, as a moisture absorbent, 20 parts by weight of calcium oxide (CaO, Aldrich, particle size: 1~5 μm) was further put into the vessel with respect to 100 parts by weight of the main components.

A homogeneous composition solution was prepared in the mixing vessel using a planetary mixer (Kurabo Industries, KK-250s).

EXAMPLE 2

An adhesive composition was prepared by the same method as described in Example 1, except that an acid anhydride-modified polyisobutylene (BASF, Glissopal SA, Mn 1000 g/mol, Mw=970 g/mol) was used as an olefin-based resin, the olefin-based resin, a heat-curable resin and a photocurable compound were put into a mixing vessel in a weight ratio of 70:20:10, and 25 parts by weight of a moisture absorbent and 2 parts by weight of an inorganic filler were put into the mixing vessel.

EXAMPLE 3

An adhesive composition was prepared by the same method as described in Example 2, except that 30 parts by weight of a moisture absorbent was put into a mixing vessel.

EXAMPLE 4

An adhesive composition was prepared by the same method as described in Example 1, except that an acid anhydride-modified polyisobutylene (BASF, Glissopal SA, Mn 1000 g/mol) as an olefin-based resin, an aromatic epoxy resin (DIC, Epiclon 850, epoxy equivalent weight: 184 g/eq, viscosity: 11000 cPs) as a heat-curable resin and trimethylol propane triacrylate (Sartomer, SR351) as a photocurable compound were put into a mixing vessel in a weight ratio of 60:30:10 (PB2400:Epiclon 850:SR351).

COMPARATIVE EXAMPLE 1

An alicyclic epoxy resin (Mitsubishi Chemical, YX8000, epoxy equivalent weight: 205 g/eq, viscosity: 18500 cPs) and an aromatic epoxy resin (DIC, Epiclon 850, epoxy equivalent weight: 184 g/eq, viscosity: 11000 cPs) were put into a mixing vessel in a weight ratio of 50:50 (YX8000:Epiclon850) at room temperature. 5 parts by weight of an imidazole-based curing agent (2P4MZ, 2-phenyl-4-methylimidazole, Shikoku) as a heat-curing agent was put into the vessel with respect to 100 parts by weight of the main components (the alicyclic epoxy resin and the aromatic epoxy resin), and 1 part by weight of an epoxy silane (glycidyloxypropyl trimethoxysilane, KBM403, Shinetsu) was put into the vessel with respect to 100 parts by weight of the main components. Also, 3 parts by weight of fumed silica (Aerosil, Evonik, R805, particle size: 10~20 nm) as an inorganic filler was put into the vessel with respect to 100 parts by weight of the main components. Meanwhile, 20 parts by weight of calcium oxide (CaO, Aldrich, particle size: 1~5 μm) as a moisture absorbent was further put into the vessel with respect to 100 parts by weight of the main components.

A homogeneous composition solution was prepared in the mixing vessel using a planetary mixer (Kurabo Industries, KK-250s).

COMPARATIVE EXAMPLE 2

An adhesive composition was prepared by the same method as described in Comparative Example 1, except that a polyisobutylene resin (DAELIM PB2400, Mn=2,400 g/mol) as an olefin-based resin, instead of an aromatic epoxy resin, and an alicyclic epoxy resin (Mitsubishi Chemical, YX8000, epoxy equivalent weight: 205 g/eq, viscosity: 18500 cPs) as a heat-curable resin were put into a mixing vessel in a weight ratio of 70:30 (PB2400:YX8000).

COMPARATIVE EXAMPLE 3

A polyisobutylene resin (DAELIM PB2400, Mn=2,400 g/mol) as an olefin-based resin and trimethylol propane triacrylate (Sartomer, SR351) as a photocurable compound were put into a mixing vessel in a weight ratio of 70:30 (PB2400:SR351) at room temperature. As a radical initiator, 1 part by weight of bis(2,4,6-trimethylbenzoyl)-phenylphosphineoxide (Irgacure 819, BASF) was put into the vessel with respect to 100 parts by weight of the main components (the olefin-based rein and the photocurable compound), and 1 part by weight of an epoxy silane (glycidyloxypropyl trimethoxysilane, KBM403, Shinetsu) was put into the vessel with respect to 100 parts by weight of the main components. Also, as an inorganic filler, 3 parts by weight of fumed silica (Aerosil, Evonik, R805, particle size 10~20 nm) was put into the vessel with respect to 100 parts by weight of the main components. Meanwhile, as a moisture absorbent, 20 parts by weight of calcium oxide (CaO, Aldrich, particle size: 1~5 μm) was further put into the vessel with respect to 100 parts by weight of the main components.

A homogeneous composition solution was prepared in the mixing vessel using a planetary mixer (Kurabo Industries, KK-250s).

Hereinafter, physical properties in the examples and comparative examples were evaluated by the following methods.

1. Adhesive Durability and Reliability at High Temperature and High Humidity

The adhesive composition prepared in each one of the examples and the comparative examples was injected into a syringe, defoamed, applied to a peripheral portion (edge) of a glass substrate, and laminated with a cover substrate. Subsequently, the coated adhesive composition was irradiated with light in the UV-A wavelength range at a dose of 5 J/cm$^2$ and heated at 100° C. for 3 hours, resulting in preparing a specimen. Afterward, the specimen was maintained in a constant temperature and humidity chamber at 85° C. and 85% for about 100 hours, and observed whether or not to have lifting, bubbles or haze at an interface between the glass substrate and the adhesive. With the naked eye, when at least one lifting, bubbles or haze was observed at the interface between the glass substrate and the adhesive, it was denoted as X, when lifting, bubbles or haze was partially observed, it was denoted as Δ, and when there was no lifting, bubbles or haze, it was denoted as O.

2. Evaluation of Accelerating Lifespan of Element

A calcium test was performed to indirectly evaluate the lifespan of an OELD to which one of the adhesive compositions in the examples and the comparative examples under accelerating conditions. In detail, seven spots of calcium (Ca) each having a size of 5 mm×5 mm and to a thickness of 100 nm were deposited on a glass substrate having a size of 100 mm×100 mm, the adhesive composition prepared in the example or the exemplary embodiment was applied to coat a peripheral portion (edge) of the substrate 3 mm apart from the calcium-deposited portion using a dispenser, and each of the calcium-deposited portions on the substrate was laminated with a cover glass and pressed so that the adhesive composition had a thickness of 3 mm, and then irradiated with light in the UV-A wavelength range at a dose of 5 J/cm$^2$. Afterward, the substrate was cured in a high temperature dryer at 100° C. for 3 hours, and the encapsulated calcium (Ca) specimen was cut into pieces in a size of 14 mm×14 mm. The obtained specimens were maintained in a constant temperature and humidity chamber in an environment of 85° C. and 85% R.H. for 1000 hours. Here, when the calcium-deposited portion was a little eroded by an oxidation reaction caused by moisture permeation, it was denoted as X, some of the calcium-deposited portions were eroded, it was denoted as Δ, and when there was no change in the calcium-deposited portions, it was denoted as O.

TABLE 1

|  | High temperature high humidity adhesive durability and reliability | Evaluation of accelerating lifespan of element |
|---|---|---|
| Example1 | O | O |
| Example2 | O | O |
| Example3 | O | O |
| Example4 | Δ | Δ |
| Comparative Example1 | X | X |
| Comparative Example2 | O | X |
| Comparative Example3 | X | X |

What is claimed is:

1. An adhesive composition for encapsulating an organic electronic element, comprising:
   an olefin-based resin having a water vapor transmission rate (WVTR) of 50 g/m$^2$·day or less;
   a heat-curable resin; and
   a photocurable compound,
   wherein the olefin-based resin has a weight average molecular weight of less than 100,000,
   wherein the olefin-based resin, the heat-curable resin and the photocurable compound are comprises at 40 to 90 parts by weight, 5 to 50 parts by weight and 1 to 40 parts by weight, respectively, and
   wherein the adhesive composition is a solventless liquid at 25° C.

2. The adhesive composition of claim 1, wherein the olefin-based resin has one or more reactive functional groups having reactivity with the heat-curable resin.

3. The adhesive composition of claim 2, wherein the functional group having reactivity with the heat-curable resin is an acid anhydride group, a carboxyl group, an epoxy group, an amino group, a hydroxyl group, an isocyanate group, an oxazoline group, an oxetane group, a cyanate group, a phenol group, a hydrazide group or an amide group.

4. The adhesive composition of claim 1, wherein heat-curable resin comprises at least one heat-curable functional group.

5. The adhesive composition of claim 4, wherein the heat-curable functional group comprises an epoxy group, an isocyanate group, a hydroxyl group, a carboxyl group or an amide group.

6. The adhesive composition of claim 1, wherein the heat-curable resin is comprised at 10 to 70 parts by weight with respect to 100 parts by weight of the olefin-based resin.

7. The adhesive composition of claim 1, further comprising:
   a heat-curing agent.

8. The adhesive composition of claim 7, wherein the heat-curing agent is a latent curing agent.

9. The adhesive composition of claim 8, wherein the heat-curing agent is comprised at 1 to 30 parts by weight with respect to 100 parts by weight of the heat-curable resin.

10. The adhesive composition of claim 1, wherein the photocurable compound is a multifunctional active energy ray-polymerizable compound.

11. The adhesive composition of claim 1, wherein the photocurable compound is comprised at 10 to 100 parts by weight with respect to 100 parts by weight of the olefin-based resin.

12. The adhesive composition of claim 1, further comprising:
   a photoradical initiator at 0.1 to 20 parts by weight with respect to 100 parts by weight of the photocurable compound.

13. The adhesive composition of claim 1, further comprising:
   a moisture absorbent.

14. The adhesive composition of claim 13, wherein the moisture absorbent is included at 5 to 100 parts by weight with respect to 100 parts by weight of the olefin-based resin.

15. An organic electronic device, comprising:
   a substrate;
   an organic electronic element formed on the substrate; and
   a side encapsulation layer formed on a peripheral portion of the substrate to surround side surfaces of the organic electronic element, and comprising the adhesive composition of claim 1.

16. The organic electronic device of claim 15, further comprising:
an entire encapsulation layer for covering the entire surface of the organic electronic element,
wherein the entire encapsulation layer is present in the same plane as the side encapsulation layer.

17. A method of manufacturing an organic electronic device, comprising:
applying the adhesive composition of claim 1 to a peripheral portion of a substrate on which an organic electronic element is formed to surround side surfaces of the organic electronic element;
irradiating the adhesive composition with light; and
heating the adhesive composition.

* * * * *